US011239150B2

(12) United States Patent
Libsch et al.

(10) Patent No.: US 11,239,150 B2
(45) Date of Patent: Feb. 1, 2022

(54) BATTERY-FREE AND SUBSTRATE-FREE IOT AND AI SYSTEM PACKAGE

(71) Applicant: INTERNATIONAL BUSINESS MACHINES CORPORATION, Armonk, NY (US)

(72) Inventors: Frank Robert Libsch, White Plains, NY (US); Stephen W. Bedell, Wappingers Falls, NY (US); Ning Li, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 21 days.

(21) Appl. No.: 16/830,209

(22) Filed: Mar. 25, 2020

(65) Prior Publication Data

US 2021/0305149 A1 Sep. 30, 2021

(51) Int. Cl.
*H01L 23/50* (2006.01)
*H01L 23/66* (2006.01)
*H01L 23/31* (2006.01)
*H01L 25/16* (2006.01)
*H02J 7/34* (2006.01)

(52) U.S. Cl.
CPC .......... *H01L 23/50* (2013.01); *H01L 23/3157* (2013.01); *H01L 23/66* (2013.01); *H01L 25/167* (2013.01); *H02J 7/345* (2013.01)

(58) Field of Classification Search
CPC ....... H01L 23/50; H01L 25/167; H01L 23/66; H01L 23/3157; H02J 7/345
USPC ........................................................ 257/777
See application file for complete search history.

(56) References Cited

U.S. PATENT DOCUMENTS

| 8,761,842 | B2 | 6/2014 | Jacobs |
| 9,935,088 | B2 | 4/2018 | Budd et al. |
| 10,317,938 | B2 | 6/2019 | Goh et al. |
| 2001/0033952 | A1 | 10/2001 | Jenson |
| 2003/0015728 | A1 | 1/2003 | Bosco et al. |
| 2007/0220272 | A1* | 9/2007 | Campisi ............... G06Q 20/341 713/186 |
| 2013/0207548 | A1* | 8/2013 | Leshniak ............... H05B 45/48 315/121 |
| 2017/0092994 | A1 | 3/2017 | Canfield |
| 2017/0249493 | A1 | 8/2017 | Yu |

(Continued)

FOREIGN PATENT DOCUMENTS

CN 109407125 A 3/2019

OTHER PUBLICATIONS

List of IBM Patents or Patent Applications Treated as Related, 2 pgs.

(Continued)

*Primary Examiner* — Duy T Nguyen
(74) *Attorney, Agent, or Firm* — Intelletek Law Group, PLLC; Gabriel Daniel, Esq.

(57) ABSTRACT

A tetherless system-in-package includes a first integrated circuit (IC) chip having interconnects and energy harvesting elements. A super-capacitor is configured to store a charge output by the energy harvesting elements. At least a second IC chipset including a smart chip and an optical I/O or an RF I/O is aligned and bonded to at least one of the interconnects of the first IC chip. The first IC chip and the second IC chip are configured to receive a portion of the charge stored by the super-capacitor.

16 Claims, 5 Drawing Sheets

(56) References Cited

U.S. PATENT DOCUMENTS

| | | |
|---|---|---|
| 2018/0198159 A1 | 7/2018 | Azami |
| 2018/0308799 A1 | 10/2018 | Dalal et al. |
| 2019/0206798 A1 | 7/2019 | Collins et al. |
| 2019/0252924 A1* | 8/2019 | Bito .................... H04B 1/1607 |
| 2019/0261470 A1 | 8/2019 | Wang |
| 2019/0287208 A1 | 9/2019 | Yerli |
| 2020/0065278 A1* | 2/2020 | Lukas ................... G06F 1/3206 |
| 2020/0105705 A1* | 4/2020 | Cheng ..................... H01L 25/18 |

OTHER PUBLICATIONS

Chen, W. et al., "Development of Novel Fine Line 2.1 D Package with Organic Interposer Using Advanced Substrate-Based Process"; IEEE 68th Electronic Components and Technology Conference (2018); 6 pgs.

Islam, N. et al., "High Density Ultra-Thin Organic Substrates for Advanced Flip Chip Packages"; IEEE 69th Electronic Components and Technology Conference (2019); 5 pgs.

La Rosa, R. et al., "Strategies and Techniques for Powering Wireless Sensor Nodes through Energy Harvesting and Wireless Power Transfer"; Sensors (2019); vol. 19:2660; 16 pgs.

\* cited by examiner

BATTERY-FREE AND SUBSTRATE-FREE IOT AND AI SYSTEM PACKAGE

BACKGROUND

Technical Field

The present disclosure generally relates to planar electronic devices that are untethered from a power supply. More particularly, the present disclosure is related to an untethered integrated circuit (IC) package structure and method of assembly.

Description of the Related Art

With the progression of the Internet of Things (IoT) and Artificial Intelligence (AI), there is an increased interest in miniaturized planar devices that may not be practically tethered to a conventional power source. For example, smart devices that are part of an Internet of Things (IoT) network, and/or an Artificial Intelligence (AI) system package may be microscopic in size and remotely located from a base system.

SUMMARY

According to various embodiments, a tetherless system-in-package includes a first integrated circuit (IC) chip including interconnects and one or more energy harvesting elements. A super-capacitor is coupled to the energy harvesting elements and is configured to store a charge output by the energy harvesting elements. At least a second IC chip is aligned and bonded to one or more of the interconnects of the first IC chip. The second IC chip is configured to receive a portion of the charged store by the super-capacitor.

In an embodiment, a rectifier is configured to convert the charge output from the energy harvesting elements prior to storage in the super-capacitor, and wherein the system-in-package is battery-free and the first IC chip and second IC chip are chip-to-chip bonded without a passive base substrate.

In an embodiment, the energy harvesting elements include photovoltaic elements for harvesting energy.

In an embodiment, the photovoltaic elements include photodiodes configured for incoming optical communication.

In an embodiment, the second IC chip includes a smart chip and an LED chip are both connected to the interconnects of the first IC chip.

In an embodiment, the first IC chip and the second IC chip are bonded by a controlled collapse chip connection (C4) process.

In an embodiment, the energy harvesting elements include an RF I/O to harvest energy from ambient RF signals.

In an embodiment, a rectifier receives and converts the charge output from photodiodes prior to being stored in a supercapacitor.

In an embodiment, the energy harvesting elements include a voltage regulator configured to output a respective operating voltage to the first IC chip, the smart chip and the LED chip.

In an embodiment, the electronic package further includes a lid and a thermal interface material overlaying the two or more IC chips.

In one embodiment, a tetherless multichip structure includes a primary active integrated circuit (IC) chip having a circuit side surface configured to support at least one secondary IC chip arranged thereon and electrically connected to the primary active IC chip in a planar packaging arrangement without a passive base substrate. A primary power source includes one or more energy harvesting elements configured to output a charge to power the primary active IC chip and the secondary IC chip. A super-capacitor is configured to store the charge output of the energy harvesting elements, and the primary IC chip and the at least one secondary IC chip are configured to receive a portion of the charge stored by the super-capacitor.

In an embodiment, the primary power source is a sole power source to the active primary IC chip and the secondary IC chip.

In one embodiment, a method of assembly of a system-in-package includes the operations of aligning and bonding a smart chip and an I/O IC chip to conductive interconnects of a first integrated circuit chip. An underfill material is applied to at least one of an area between the smart chip and the first integrated circuit chip, and between the I/O IC chip and the first integrated circuit chip. A thermal interface material is applied on at least the smart chip. The first integrated circuit chip is configured to perform energy harvesting, and the smart chip and the I/O IC chip are bonded to the first integrated circuit without a passive base substrate.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high-level, without detail, to avoid unnecessarily obscuring aspects of the present teachings.

In the present disclosure, an untethered system-in-package structure and method of assembly provides dual functionality as both an active IC chip and as an untethered substrate for a second set of IC circuit chips. Thus, through the use of interconnects, the system-in-package structure of the present disclosure eliminates a passive base substrate because there is a chip-to-chip bonding via the interconnects. Through the incorporation of untethered energy harvesting with untethered I/O communication, the system-in-package structure of the present disclosure enables the use of new applications such as embedding the package structure into thin materials including paper, documents, currency, non-intrusive edge sensing and computation.

Example Architecture

Figure 1:
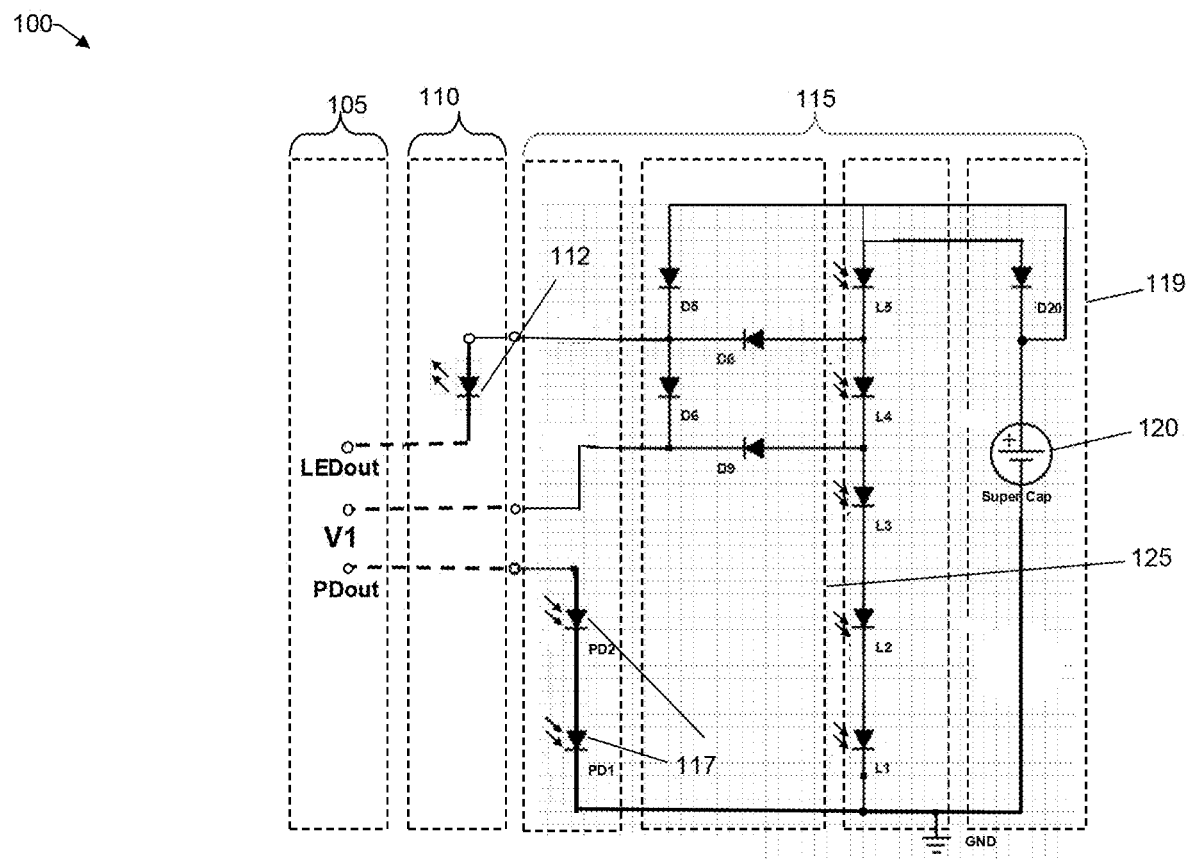
FIG. 1 is a schematic of a system-in-package, consistent with an illustrative embodiment.
Figure 2:
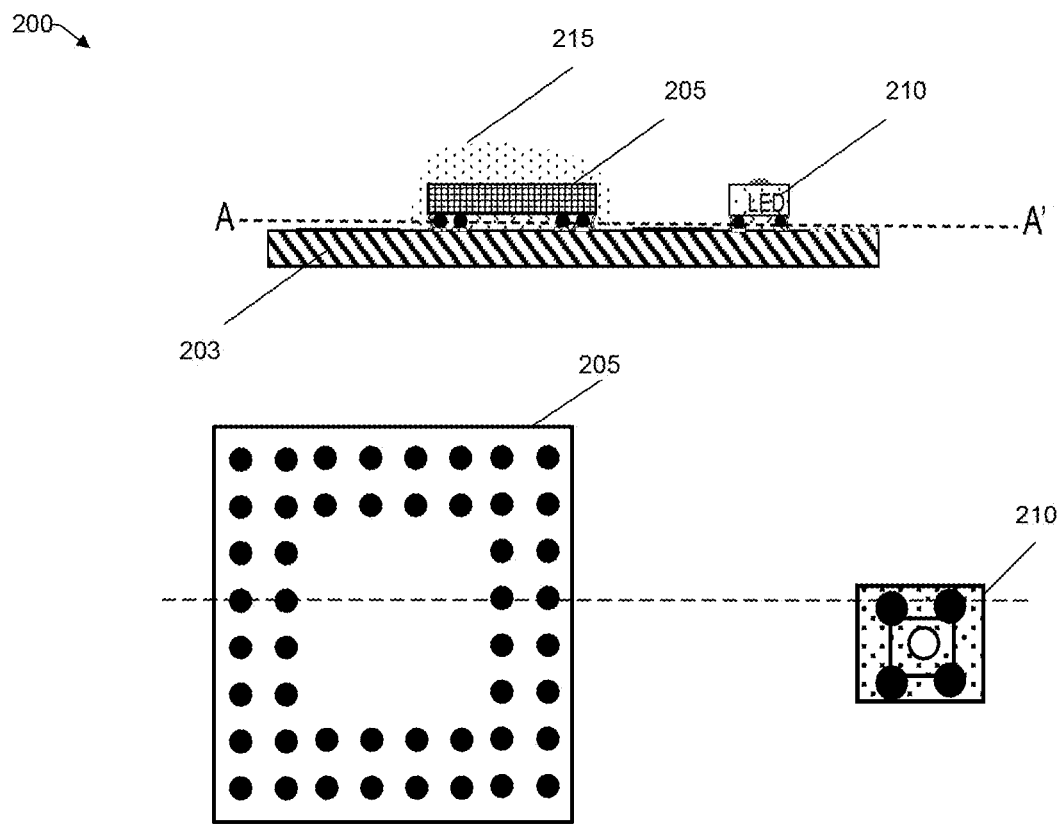
FIG. 2 is an illustration of a system-in-package with a smart chip and optical I/O, consistent with an illustrative embodiment.

FIG. 1 is a schematic of a system-in-package 100 consistent with an illustrative embodiment. The system-in-package in the illustrative embodiment includes a smart chip 105, an LED chip 110, and a silicon chip 115 with interconnects. The silicon chip 115 with interconnects (such as shown in FIG. 2) permit chip-to-chip bonding without the use of a passive substrate, which permits a reduced size that is substantially planar (e.g., 2.5 Dimensional or 2.5D). Some of the interconnects are connected to energy harvesting circuitry such as photovoltaic elements, that may include photodiodes 117 (PD1, PD2) for incoming optical communication.

The energy harvesting is based on the charge generated by the photodiodes, and the charge is stored, for example, in the supercapacitor 120. A rectifier 119 receives and converts the charge from the photodiodes prior to storage in the supercapacitor 120. Supercapacitor 120 (a.k.a. "supercaps") are high-capacity capacitors that utilize double-layer capacitance and electrochemical pseudo-capacitance instead of a dielectric. Supercaps can store more energy than electrolytic capacitors, and can be charged and deliver charge faster than batteries, and may have more charge and discharge cycles than rechargeable batteries. The energy stored by the supercapacitor 120 can be output to the smart chip 105 and the LED chip 110 to power the LED 112. The untethered system-in-package 100 can be both battery-free (utilizing power from energy harvesting and supercap energy storage) and constructed without the use of a passive base substrate.

A voltage regulator 125 can be configured to output, for example, 1.2V and 1.8V for respective supply to the smart chip circuit 105 and the LED chip circuit 110. In one non-limiting example, the supercapacitor may store at an upper limit 2.4 volts. It is to be understood that the aforementioned voltages are provided for illustrative purposes and the system-in-package of the present disclosure is not limited to such values.

It is to be understood that the optical energy harvesting is not limited to the use of photovoltaics. For example, optical nano-antennas (ONAs), such as metallic nano-antennas (rectennas that include a rectifier embedded at a feed point of an antenna) may be employed to maximize harvesting efficiency. Some ONAs can be used to extend the energy absorbed beyond the visible spectrum (400 nm-700 nm) to include infrared light.

The system-in-package 100 may be configured so the energy harvesting circuitry is normally off, and can be automatically turned on. In addition, the energy harvesting circuitry can be self-regulating. The system-in-package 100 is not limited to energy harvesting by optical components such as photovoltaics, and may employ, for example, energy harvesting of RF, the harvesting of kinetic energy, or harvesting of temperature differential. The particular application of the system-in-package may be a factor in the type of energy harvesting used.

FIG. 2 is an illustration of a system-in-package 200 with a smart chip 205 and optical I/O, consistent with an illustrative embodiment. The silicon IC chip 203 with interconnects is bonded to the smart chip 205 and the LED 210. The bonding of the smart chip 205 and the LED 210 to the silicon IC chip 203 with interconnects is a face-to-face bonding. Thus, a passive base substrate is not needed, saving on construction costs, and permitting a smaller, more planar construction that approaches 2.5 Dimensional. The face-to-face bonding performed can be a control collapsed chip connection (C4) bonding.

The silicon IC chip 203 with interconnects can be configured to include older processing node circuit functionalities for reduced costs, and may also include energy harvesting (photovoltaic/RF) circuitry, energy functions (battery regulation and monitoring), ESD and other circuits. A low cost seal, such as glob-top, can be used for hermetic sealing of other IC's to the silicon IC chip 203 with interconnects after the bonding has been performed. The interconnects are not limited to C4 bonding. For example, chip thru vias may be utilized. The interconnects may have a similar pitch between different types of chips. In addition, the interconnects may be constructed of metal materials that include Ni, Pt, Al, Cu, Ag, Sn, or other compatible metals, or a conductive semiconductor or polymer material.

Figure 3:
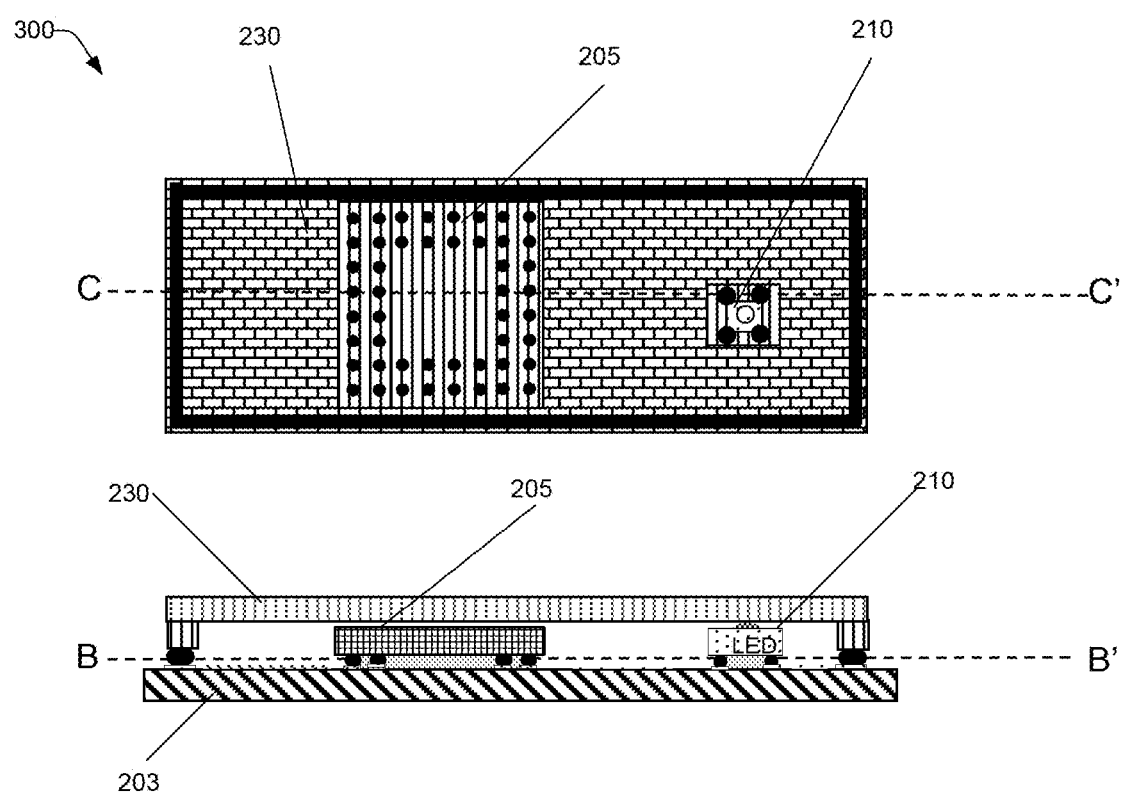
FIG. 3 an illustration of a system-in-package having a hermetically sealed smart chip and Optical I/O, consistent with an illustrative embodiment.

FIG. 3 is an illustration of a system-in-package 300 having a hermetically sealed smart chip and Optical I/O, consistent with an illustrative embodiment. A lid 230 is arranged at peripheral areas of the upper surface of the silicon IC chip 203. An adhesive or even metal solder bonding may adhere the lid 230 to the surface of the silicon IC chip 203. The lid 230 provides protection to integrated circuits such as the smart chip 205 and the LED 210. The lid 230 in FIG. 3 may be constructed of an optically transparent material to allow optical communication from outbound LED 210 transmission and inbound photodiode on 203 receiver.

The LED 210 may be constructed to have a focusing, defocusing function tailored to a photo-detector or reader. The LED 210 may include a separate lens component that is aligned, or self-aligned. One such example of alignment includes sideways restoring force by solder melt wetting to the LED or a dielectric layer fabricated on, for example, a GaN LED substrate. In the case where a bottom emitting LED is used, the package lid 230 need not be optically transparent and may be constructed of opaque material such as metal or plastic.

A thermal insulating material (TIM) (not shown) may be arranged between an upper surface of semiconductor chip 205, and if optically downward emitting, LED 210, and the lid 230. In addition, an underfill material may be arranged between each of the semiconductor chips 205, 210 and the silicon IC chip 203 with interconnects. The underfill material between IC chips 205, 210 and 203 provides added mechanical adhesion and an environmental barrier for improved robustness, for example, against shock and vibration, moisture, contaminants, radiation, and operating environments such with thermal and mechanical stresses.

Figure 4:
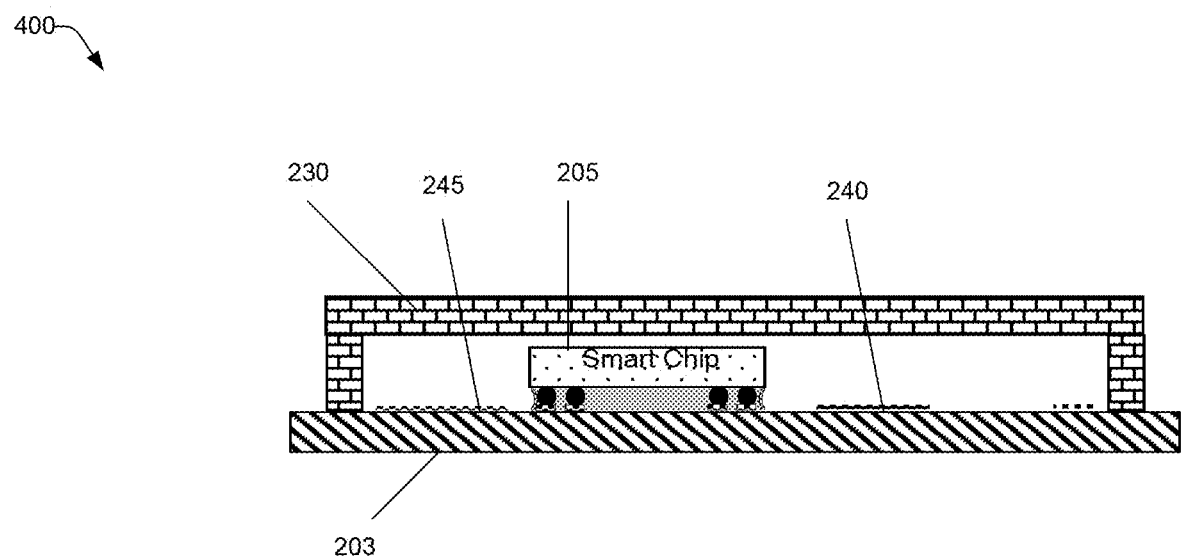
FIG. 4 is an illustration of a system-in-package with a smart chip and RF I/O, consistent with an illustrative embodiment.

FIG. 4 is an illustration of a system-in-package 400 with a smart chip and RF I/O, consistent with an illustrative embodiment. The system-in-package 400 performs energy harvesting of ambient radio waves. An antenna 240, such as a dipole or a loop, for example, may function as an input device by receiving RF signals. The radio waves received by an antenna cause a change in potential across the length of the antenna 240. A circuit 245 that performs RF-to-DC conversion may be configured to generate a voltage based on the RF signal received. One or more supercaps 120 (see FIG. 1) can be used to store the charge. A supercap 120 such as shown in FIG. 1 can be discharged to provide power to the silicon IC chip 203 with interconnects, the smart chip 205, and the LED chip 210. The package lid 230 may be constructed of an RF transparent material, such as glass, plastic, etc.

Example Process

Figure 5:
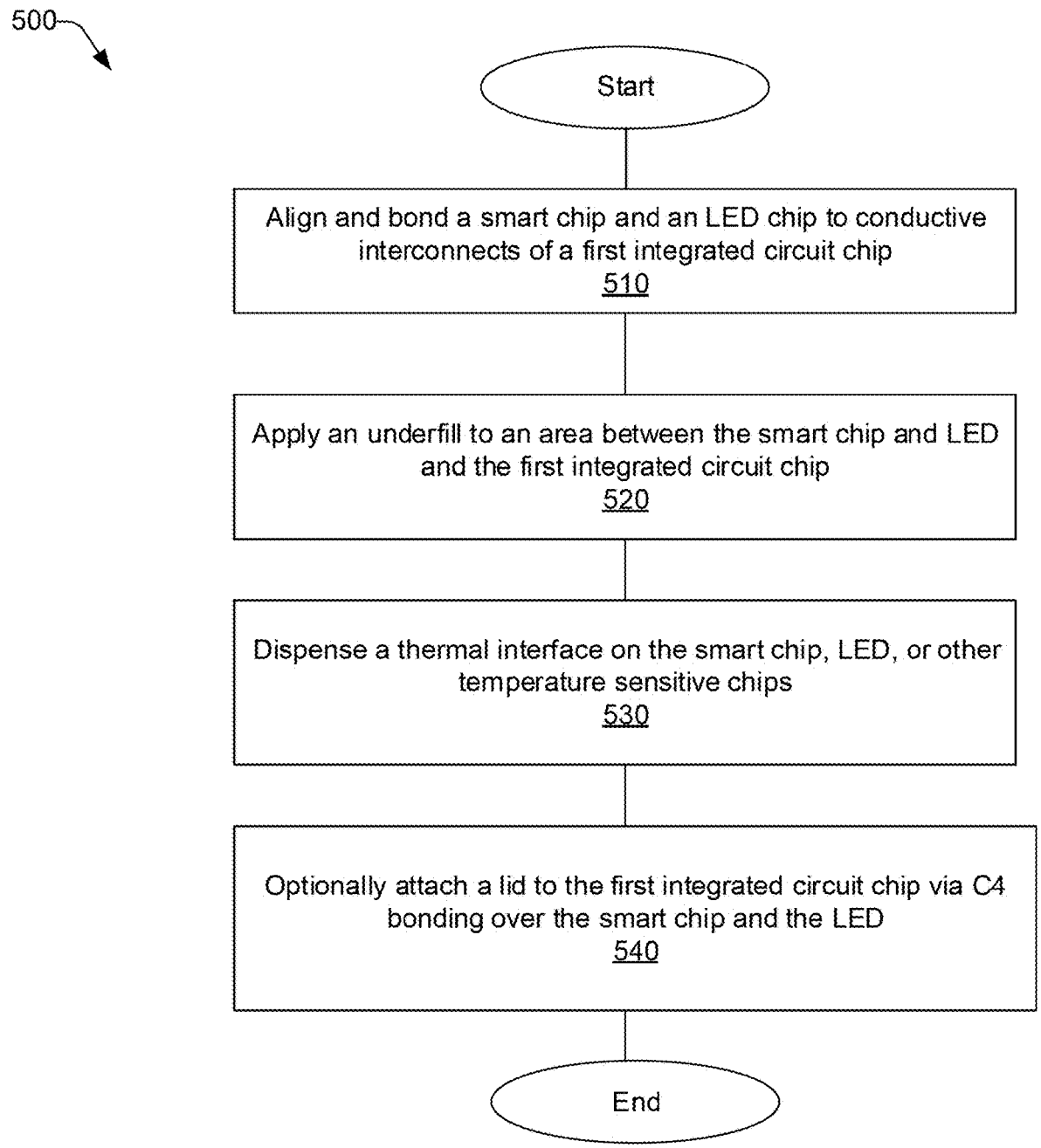
FIG. 5 is a flowchart of an assembly process of a smart chip and an optical module with a first IC chip with interconnects, consistent with an illustrative embodiment.

With the foregoing overview of the example architecture, it may be helpful now to consider a high-level discussion of example process. To that end, FIG. 5 is a flowchart 500 of an assembly process of a system-in-package, consistent with an illustrative embodiment shown in FIG. 3. It is to be understood that the assembly process is also applicable to a process in which optical I/O or RF I/O is used for energy harvesting.

At operation 510, a smart chip 205 is and an LED chip 210 are aligned and bonded to conductive interconnects of a first integrated circuit chip 203. The bonding of the IC chips 203, 205, 210 can be a face-to-face bonding utilizing C4 bonding techniques. For example, there can be a pre-C4 metallurgical bonding spraying process via a mask utilizing a no-clean flux. Each of the smart chips 205 and LED 210 can be bonded via a pick, place and bond reflow process. The IC chips 203, 205, 210 are aligned and bonded without the use of a passive base substrate.

At operation 520, an underfill material is applied between the lower portions of the smart chip 205 and the LED chip 210, and silicon IC chip 203. The underfill material adds mechanical bonding strength and provides an environmental barrier to the IC chips 203, 205, 210 from, for example, shock and vibration, moisture, contaminants, radiation, and operating environments such with thermal and mechanical stresses. In one embodiment, the underfill material is arranged below the LED 210 for downward backside optical emitting LEDs. The underfill material is a substantially transparent underfill material. In addition, the underfill material arranged below the smart chip 210 can be the same underfill material used with the LED 210, or can be a different type of underfill material that is not transparent.

At operation 530, a thermal interface material (TIM) is dispensed on at least the smart chip 205 and the LED chip 210 if optical emission is from the bottom as with backside optical emitting LEDs. There are various TIM materials that may be used. Glob-top provides a cost effective physical protection to the integrated circuit chips and can provide some thermal coupling between components.

At operation 540, there is an optional attachment of a lid 230 to the silicon IC chip 203. The lid 230 is arranged to at least partially cover the smart chip 205 and the LED chip 210 (or the smart chip 205 and the RF I/O). The lid 230 may be constructed of a substantially transparent material so as not to degrade the operation of the LED chip 210 to transmit optical signals or the photodiode to receive optical signals. In addition, the substantially transparent material can permit the photovoltaic elements (e.g., photodiodes) to receive light utilized in the energy harvesting. In the case of RF I/O being used instead of Optical I/O, the lid 230 can be constructed of a material that does not interfere with the reception of wireless signals such as ambient RF signals. The assembly process for this illustrative embodiment may end at operation 530, or operation 540 if the lid 230 is attached.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In any case, the chip can then be integrated with other chips, discrete circuit elements, and/or other signal processing devices as part of either (a) an intermediate product, or (b) an end product. The end product can be any product that includes integrated circuit chips.

A "smart chip," as discussed herein, refers to a very small device that has a microprocessor or other logic circuits, and resources for data creation (such as embedded sensors) and processing. For example, a smart, chip may be embedded in the layers of a smart card such as a credit card; and can be configured for authentication; data processing, data storage and communication, just to name a few possible operations. Smart chips may be hermetically sealed and can be arranged in a package that includes optical I/O, and/or RF I/O. Smart chips are often untethered from a power source, and may include energy harvesting utilizing, (for example, via photovoltaics, kinetic energy, or RE energy from the environment via an antenna) to operate. In addition, solid-state batteries or supercaps may be used to provide a lasting source of power, and may be stackable to provide various voltages or currents for the integrated circuit package as desired. It should be understood through the disclosure that the illustration and reference to smart chips, LED, and optical and RE I/O are provided for illustrative purposes and do not limit the appended claims to the illustrations described herein.

The system-in-package and method of manufacture in the present disclosure advantageously utilizes the first IC chip to function as an active IC chip, and to serve as an untethered substrate for the smart chip and the LED or RE I/O chips, thereby eliminating inclusion of the passive base substrate. The footprint of the system-in-package is reduced and the power usage is decreased by the construction. For example, by chip-to-chip bonding via the interconnects, the shortest electric path is used, thereby reducing power consuming parasitics. Also, battery-associated circuitry is eliminated, and the heterogeneous integration flexibility of the most power efficient components (such as LEDs) is enabled. A minimal footprint and tetherless construction is more environmentally friendly, particularly as applications for such system-in package devices are often remotely located and may not be retrievable for surface or at the end of the life cycle. There is also a minimal height in the Z direction due to the elimination of the passive base substrate. Planar packaging can be used due to the low vertical profile.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A tetherless system-in-package, comprising:
    a first integrated circuit (IC) chip including interconnects and one or more energy harvesting elements;
    a super-capacitor connected to the one or more energy harvesting elements and configured to store a charge output by the energy harvesting elements; and
    at least a second IC chip aligned and bonded to at least one of the interconnects of the first IC chip;
    wherein the first IC chip and the second IC chip are configured to receive a portion of the charge stored by the super-capacitor.

2. The tetherless system-in-package according to claim 1, further comprising a rectifier configured to convert the charge output from the energy harvesting elements prior to storage in the super-capacitor, wherein:
    the system-in-package is battery-free, and
    the first IC chip and the second IC chip are chip-to-chip bonded without a passive base substrate.

3. The tetherless system-in-package according to claim 2, wherein the first IC chip and the second IC chip are bonded by a controlled collapse chip connection (C4) process.

4. The tetherless system-in-package according to claim 2, wherein the energy harvesting elements include photovoltaic elements.

5. The tetherless system-in-package according to claim 4, wherein the photovoltaic elements comprise photodiodes configured for incoming optical communication.

6. The tetherless system-in-package according to claim 2, wherein the energy harvesting elements include nano-antennas having the rectifier embedded at a feed point.

7. The tetherless system-in-package according to claim 4, wherein the second IC chip includes a smart chip and an LED chip connected to the interconnects of the first IC chip.

8. The tetherless system-in-package according to claim 7, wherein the energy harvesting elements include a voltage regulator configured to output a respective operating voltage to the first IC chip, the smart chip and the LED chip.

9. The tetherless system-in-package according to claim 8, further comprising a lid arranged over the smart chip and the LED chip, wherein the lid is bonded to the first IC chip.

10. The tetherless system-in-package according to claim 9, wherein at least a portion of the lid that is aligned over the LED chip is constructed of a substantially transparent material.

11. A tetherless multichip structure, comprising:
    a primary active integrated circuit (IC) chip having a circuit side surface configured to support at least one secondary IC chip arranged thereon and electrically connected to the primary active IC chip in a planar packaging arrangement without a passive base substrate;
    a primary power source including one or more energy harvesting elements configured to output a charge to power the primary active IC chip and the secondary IC chip; and
    a super-capacitor configured to store the charge output of the energy harvesting elements;

wherein the primary IC chip and the at least one secondary IC chip are configured to receive a portion of the charge stored by the super-capacitor.

12. The tetherless multichip structure according to claim 11, wherein the primary power source is a sole power source to the active primary IC chip and the secondary IC chip.

13. The tetherless multichip structure according to claim 11, further comprising a hermetically sealed lid arranged over the circuit side of the primary IC chip.

14. The tetherless multichip structure according to claim 13, wherein the energy harvesting elements include photovoltaic elements; and
the hermetically sealed lid is optically transparent.

15. The tetherless multichip structure according to claim 11, further comprising a rectifier circuit coupled to the energy harvesting elements, and configured to perform RF-to-DC conversion to generate a voltage based on an RF signal; and
the active primary IC chip further comprises interconnects; and
at least one secondary IC chip is aligned and bonded to a portion of the interconnects of the active primary IC chip.

16. The tetherless multichip structure according to claim 11, wherein the at least one secondary IC chip includes a smart chip and an antenna circuit connected to the interconnects of the active primary IC chip.

* * * * *